United States Patent [19]

Adachi

[11] Patent Number: 5,502,631
[45] Date of Patent: Mar. 26, 1996

[54] CIRCUIT ELEMENTS THAT ARE ULTRASONICALLY WELDED TOGETHER

[75] Inventor: Yoshio Adachi, Kodaira, Japan

[73] Assignee: AUE Institute, Ltd., Kodaira, Japan

[21] Appl. No.: 320,110

[22] Filed: Oct. 7, 1994

Related U.S. Application Data

[63] Continuation of Ser. No. 691,342, Apr. 25, 1991, abandoned.

[51] Int. Cl.⁶ ........................... H05K 7/02; H01L 23/544
[52] U.S. Cl. ................ 361/760; 228/180.1; 228/180.21; 228/180.22; 257/737; 257/797; 361/777; 361/779; 361/782; 361/783; 437/212
[58] Field of Search ............................. 29/832, 833, 834, 29/837, 840; 174/250, 253, 254, 255, 256, 258, 260; 228/179.1, 180.1, 180.21, 180.22; 257/723, 724, 725, 778, 777, 737; 361/760, 767, 768, 771, 797, 779, 782, 783, 813; 437/209, 212, 215, 216, 217, 219; 156/73.1, 73.5, 73.6

[56] References Cited

U.S. PATENT DOCUMENTS

| | | |
|---|---|---|
| 3,403,438 | 10/1968 | Best et al. . |
| 4,641,176 | 2/1987 | Keryhuel et al. ................ 361/408 |
| 4,929,999 | 5/1990 | Hoeberechts et al. ............ 257/782 |
| 4,967,262 | 10/1990 | Farnworth ......................... 257/797 |
| 4,975,763 | 12/1990 | Baudouin et al. ................. 257/797 |
| 5,018,005 | 5/1991 | Lin et al. ............................ 257/724 |
| 5,034,802 | 7/1991 | Liebes, Jr. et al. ................ 361/760 |
| 5,081,520 | 1/1992 | Yoshii et al. ...................... 257/797 |
| 5,126,920 | 6/1992 | Cardashian et al. .............. 361/400 |

FOREIGN PATENT DOCUMENTS

| | | |
|---|---|---|
| 0130410 | 1/1985 | European Pat. Off. ................ 29/832 |
| 0312217 | 4/1989 | European Pat. Off. ................ 257/797 |
| 1331507 | 11/1963 | France ................................. 174/255 |
| 1765164 | 1/1971 | Germany . |
| 3-150132 | 6/1991 | Japan ................................... 156/73.1 |

OTHER PUBLICATIONS

IBM Technical Bulletin "Silicon–To–Silicon Part Alignment System" vol. 25 No. 4 Sep. 1982 (pp. 2094–2095).
Patent Abstracts of Japan vol. 015, No. 148 (E–1056) 15 Apr. 1991 & UP–A–3 024 742 (Seiko Epson Corp) 1 Feb. 1991.

*Primary Examiner*—Donald A. Sparks
*Attorney, Agent, or Firm*—Gottlieb, Rackman & Reisman

[57] ABSTRACT

A new and improved electronic circuit and a method of producing the same is provided in which at least one electronic element is ultrasonically welded to a printed circuit board to create the electronic circuit. Proper alignment between terminals of a conductive circuit pattern on the circuit board and terminal units on the connecting surface of the electronic element is ensured by a variety of techniques: (i) small protuberances on the terminal units, (ii) raised sections on the bottom surface of the terminal units placed to engage indented portions of the board, and (iii) corresponding posts (on the electronic elements) and holes (formed on the circuit board). The ultrasonic welding of the element to the printed circuit board is typically conducted at a frequency range between 25–30 megahertz which produces a vibration which grinds the terminal units of the electronic element to the terminals of the circuit pattern while also welding the element and circuit board together. Electronic circuits formed in accordance with the inventive concept disclosed herein can be comprised of stacked or interlocking combinations of weldable electronic elements. Such structures can improve rigidity and vary spacial relationships of electronic circuits.

10 Claims, 3 Drawing Sheets

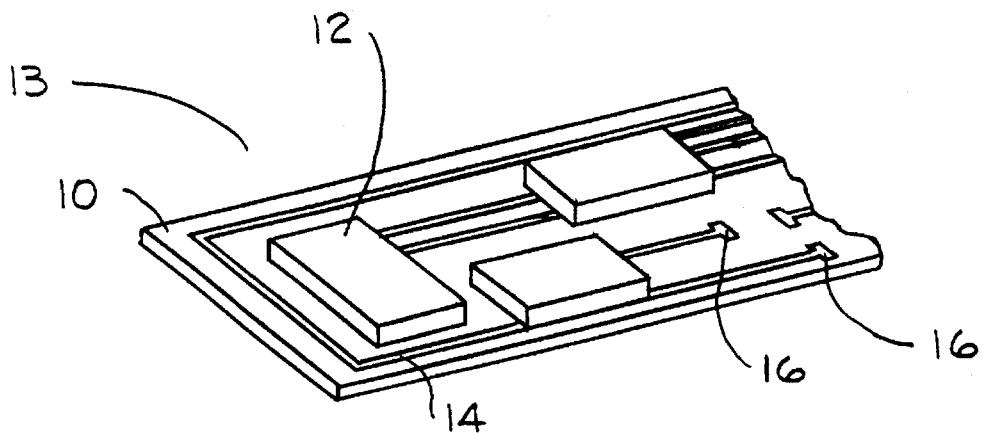
FIG. 1
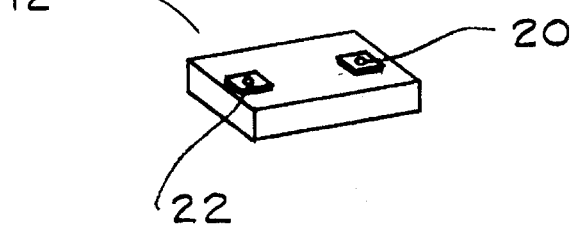
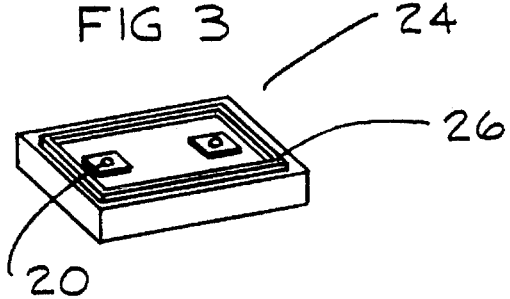
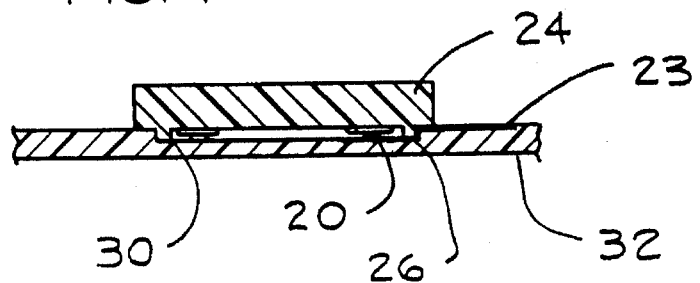

CIRCUIT ELEMENTS THAT ARE ULTRASONICALLY WELDED TOGETHER

This application is a continuation, of application Ser. No. 07/691,342, filed Apr. 25, 1991, now abandoned.

FOREIGN PRIORITY

Priority of the present application is claimed pursuant to 35 U.S.C. §119 based on the Aug. 22, 1990 filing of a Japanese patent application entitled "Electrical Circuits And A Method For Their Manufacture By Means Of Ultrasonic Welding" on behalf of AUE Research Laboratory of Kodaira City, Tokyo, Japan.

FIELD OF THE INVENTION

The present invention pertains generally to the manufacture of electronic circuits and, more particularly, to electronic circuits manufactured by ultrasonic welding techniques.

BACKGROUND OF THE INVENTION

In an early prior art method of manufacturing electronic circuits, small apertures were formed on printed circuit boards. The electronic elements contained metal leads which were first inserted into the small apertures on the board and then soldered to the board to complete the electronic circuit. Both the insertion step and the soldering step were performed manually. Due to the tediousness and complexity of such labor, a high failure rate was encountered and costs remained high.

Further developments in the prior art ultimately yielded methods of automatically inserting the leads of the electronic elements in the apertures of the printed circuit boards and, after the immersion of the boards into soldering tanks, automatically soldering the leads to the boards.

While the automation of the insertion and soldering steps somewhat reduced the failure rates in the manufacturing of electronic circuits, problems remained. For instance, in the automatic insertion step, it became necessary to ensure proper alignment of the elements on the board, to undergo taping of the elements to the board once alignment was assured, and to correct bends in the leads when insertion was complete. In the automatic soldering step, the necessity of masking the circuit board, checking the deterioration of the solder and controlling the temperature during soldering led to both increased complexity and increased defects. Moreover, after the soldering process was completed, it was still necessary to cut the lead junction, check for faulty junctions, repair faulty junctions, and clean the circuit board. These post-fabrication steps resulted in increased labor costs and eliminated the possibility of immediate post-fabrication continuity testing.

The latest development in the manufacture of electronic circuits, surface mounting technology, has eliminated the need for metal leads and corresponding apertures in the printed circuit boards. Instead, the electronic elements are soldered directly onto the printed circuit boards. Problems encountered in the earlier prior art due to the fragile nature of the leads have thus been eliminated. Other problems remain. For instance, strict temperature control during the soldering step is still necessary to avoid deterioration of the solder. Moreover, as in the previous prior art techniques described, the spacing between neighboring elements or soldered leads could not be reduced below approximately 2 mm due to the tendency of solder to expand. When the solder expands between neighboring junctions (whether between two lead junctions or two elements), a shorted circuit is the undesired result. In order to reduce the possibility of shorts due to the soldering step, a spacing of approximately 2 mm between junctions is required. This minimal spacing requirement prohibited further minimization of circuits which is particularly vital in complex circuit applications.

Another problem in prior art methods of fabricating electronic circuits was encountered as the number of elements attached to the board increased. The increased weight of the elements negatively affected rigidity of the electronic circuit by causing the board to bend, buckle, or, in the worst case, break completely. The need for increased rigidity was particularly important in applications where high shocks to the circuit board might occur. The only way to increase rigidity in such prior art applications was to increase the thickness of the circuit board. This, of course, required longer, more fragile leads on the electronic elements.

Furthermore, in all electronic circuits requiring a soldering step, the risk of contamination to the circuit due to moisture or chemicals seeping between the board and the electronic elements is often unacceptably high. The risk of defective electronic circuits due to contamination remains high despite high cost efforts to create contaminant-free manufacturing environments.

SUMMARY OF THE INVENTION

It is therefore an object of the present invention to provide a new and improved electronic circuit and a method of manufacturing the same which reduces cost and increases productivity over prior art circuits.

It is another object of the present invention to provide a new and improved electronic circuit and a method of manufacturing the same where the welding of electrical elements to a printed circuit board is performed simultaneously with the positioning of the electronic elements on the board without the need for soldering.

It is yet another object of the present invention to provide a new and improved electronic circuit and a method of manufacturing the same which allows ultrasonic welding of individual electronic elements to the printed circuit board while avoiding contamination of the electronic circuit by either moisture or chemicals.

It is still further an object of the present invention to provide a new and improved electronic circuit and a method of manufacturing the same which allows continuity testing simultaneously with the welding of individual electronic elements to the printed circuit board, thereby nearly eliminating end-product defects.

It is yet another object of the present invention to provide a new and improved electronic circuit and a method of manufacturing the same wherein the rigidity of the circuit can be increased without increasing the thickness of the printed circuit board.

Another object of the present invention is to provide a new and improved electronic circuit and a method of manufacturing the same which permits efficient alignment of the electronic elements and the circuit board without any need of a taping operation.

Still another object of the present invention is to provide a new and improved electronic circuit and a method of manufacturing the same which eliminates the need for strict temperature control during fabrication steps.

It is further an object of the present invention to provide a new and improved electronic circuit and a method of manufacturing the same which minimizes the spacing between electronic elements.

These and other objects and advantages of the present invention are achieved by ultrasonically welding electronic elements to an ultrasonically weldable circuit board. Proper alignment between conductive circuit patterns formed on the circuit board and terminal units on the bottom surface of the electronic elements is ensured by a variety of techniques.

For instance, proper alignment of terminal units and terminal conductive circuit patterns can be ensured by small protuberances on the terminal units. Alternatively, raised sections on the bottom surface of the electronic elements shaped to engage with indented portions of the circuit board can be utilized to assure proper alignment. Still another technique of insuring proper alignment between terminal units and conductive circuit patterns utilizes circular posts on the electronic elements to be inserted in matching holes on the circuit board.

Electronic circuits manufactured by means of the method provided herein can improve space relationships by stacking various electronic elements or components on top of one another. This stacking is achieved by supplying alignment means on both the top and bottom surfaces of an electronic element to be welded to the circuit board. Furthermore, these electronic elements can be shaped in various formations, such as round posts or hexagonal shapes.

BRIEF DESCRIPTION OF THE DRAWINGS

The above-mentioned and other features and objects of the present invention and the manner of attaining them will become more apparent and the invention itself will be best understood by reference to the following description of several embodiments of the invention taken in conjunction with the accompanying drawings, wherein:

FIG. 1 is a schematic illustration of an electronic circuit embodying the present invention;

FIG. 2 is a schematic illustration of an electronic element utilized in an embodiment of the present invention;

FIG. 3 is a schematic illustration of another embodiment of an electronic element utilized in conjunction with the present invention;

FIG. 4 is a cross-sectional view representing the placement of the electronic element illustrated in FIG. 3 on a circuit board in conjunction with the teachings of the present invention;

DETAILED DESCRIPTION OF THE PREFERRED EMBODIMENTS

Figure 5:
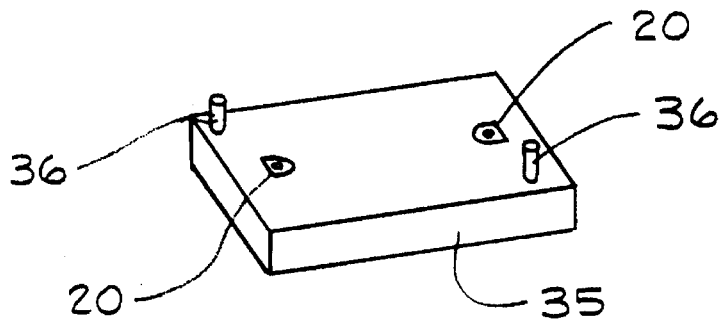
FIG. 5 is a schematic illustration of an electronic element utilized in conjunction with the present invention having round posts to ensure proper alignment with a circuit board.

Referring specifically to FIG. 1, an electronic circuit made in accordance with the present invention, and generally designated 13, is illustrated. Electronic circuit 13 consists of a circuit board 10 on which a circuit pattern 14 is formed. Circuit board 10 is formed from thermoplastic resins such as polystyrene, polyethylene, and polyamide, or from other ultrasonically weldable materials. Circuit pattern 14 printed on circuit board 10, is comprised of an electrically conducting metal such as copper. Circuit board terminals 16 are placed at prescribed positions. The plurality of electronic elements 12 which form the components of the desired electronic circuit have exteriors formed from thermoplastic resins and are ultrasonically welded to circuit board 10.

Referring specifically to FIG. 2, electronic element 12 is illustrated with its bottom surface (the surface which attaches to circuit board 10) clearly illustrated. Electronic element 12 contains terminal units 20 which, when connected to circuit board terminals 16, complete the electronic circuit. Alignment of electronic elements 12 on circuit board 10 is critical to the manufacturing of functioning electronic circuits.

One technique of ensuring proper alignment of electronic elements on printed circuit boards is by placing a small protuberance 22 on the upper surface of terminal unit 20 as shown in FIG. 2. FIG. 3 represents another technique for ensuring proper alignment between components of electronic circuit 13. A raised section 26 formed of ultrasonically weldable material is formed on the outer edge of the bottom surface of electronic element 24. Raised section 26 rises slightly above the bottom surface of electronic element 24 and encloses terminals 20.

The effectiveness of raised section 26 is illustrated in FIG. 4 which represents the placement of electronic element 24 on a circuit board 32. The surface of circuit board 32, which includes a circuit pattern 23, has an indented region 30 into which the outer edge of raised section 26 fits. This interlocking formation of raised section 26 with indented section 30 assures the proper placement of electronic element 24 on circuit board 32. Within indented section 30 of printed circuit board 32, circuit pattern 23 is set so that terminal units 20 of electronic element 24 properly align with terminals 16 (FIG. 1) of circuit pattern 14 to complete the desired circuit.

Once proper alignment is assured, circuit board 32 and electronic element 24 are welded together by an ultrasonic frequency. The ultrasonic frequency causes a vibration which grinds terminal units 20 and terminals 16 together while, at the same time, it welds the thermoplastic resin which forms the exterior of electronic element 24 to the thermoplastic resin which forms circuit board 32. Ultrasonic frequencies between 25–30 megahertz have proven to be effective for welding of the circuit board and electronic elements but other frequencies can be used. One advantage of ultrasonic welding is that the welding can be done while indented region 30 is under a vacuum. Thus, neither moisture nor chemicals can seep into terminal units 20 causing defective circuits.

FIG. 5 illustrates another exemplary embodiment of a technique for properly aligning electrical elements on a circuit board. FIG. 5 again shows a bottom surface of an electronic element 35. Electronic element 35 contains a pair of posts (or pins) which protrude from the bottom surface of electronic element 35. Opposite post 36, on a circuit board to which electronic element 35 will be connected, is a corresponding number of holes in which post 36 can be fitted. Thus, not only can positioning be reliably achieved but, moreover, during ultrasonic welding, the separation between electronic elements and the circuit board due to vibration can be prevented. The use of posts 36 and corresponding holes additionally allows for a stronger welding bond between electronic elements and a circuit board.

Figure 6:
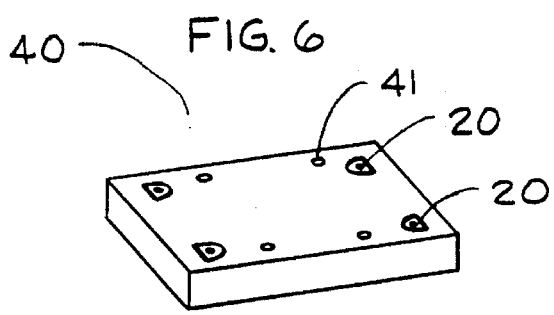
FIG. 6 is a schematic illustration of an electronic element utilized in a stacking embodiment of the present invention.

FIG. 6 is an illustration of an electronic element 40 for utilization in a stacked embodiment of the present invention. The visible top surface of electronic element 40 contains terminal units 20 and a plurality of holes 41. The bottom surface of electronic element 40 (not visible) contains terminal units and positioning posts or other alignment means to facilitate the proper connection of electronic element 40 to a circuit board. The holes and terminals on the top surface of electronic element 40 allow a similarly shaped, compatible electronic element to be welded onto electronic element 40.

The stacking capability enabled by the use of an ultrasonically weldable electronic element such as representatively illustrated in FIG. 6 permits variation in the vertical spacing of electronic elements depending upon the space environment of the area in which the board will be placed.

Figure 7:
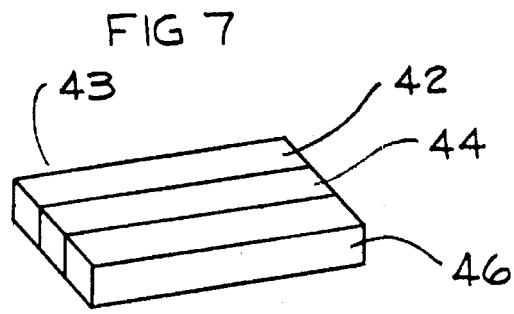
FIG. 7 is a schematic illustration of an electronic element utilized in the present invention subdivided into three separate parts.
Figure 8:
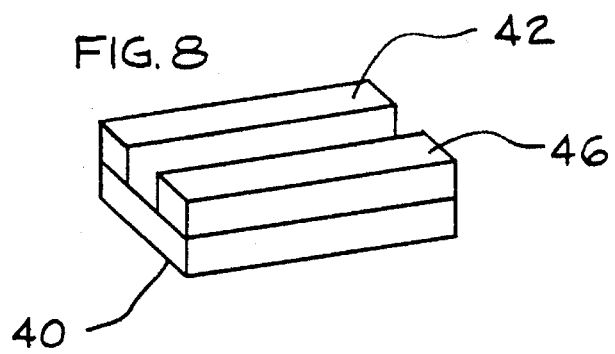
FIG. 8 is a schematic illustration of layered electronic elements utilized in conjunction with the present invention.

FIG. 7 shows an electronic element 43 subdivided into three electronic sections 42, 44 and 46. Terminals, as well as positioning protrusions, are set on the bottom surface of each of electronic sections 42, 44 and 46 to attach sections 42, 44 and 46 to a printed circuit board. Furthermore, it is possible to increase the space factor by assembling and welding each of electronic sections 42, 44 and 46 onto a larger section. For example, sections 42 and 46 are illustrated attached to standardized electronic element 40 in FIG. 8. Moreover, the facing direction of the assembly or the numbers of subdivided elements are totally left to the discretion and needs of the designer.

Figure 9:
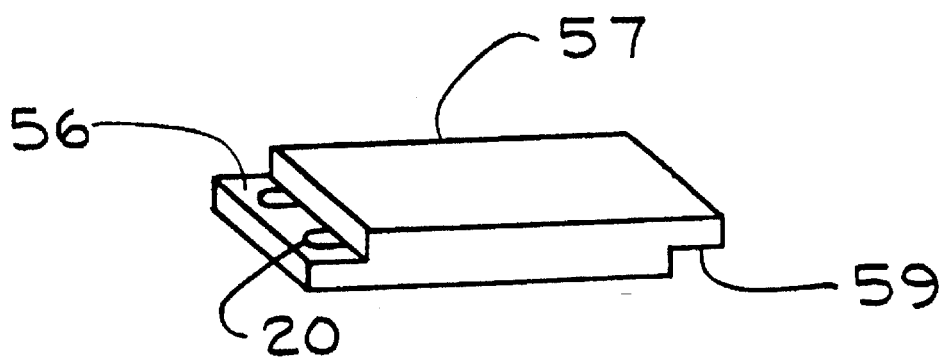
FIG. 9 is a schematic illustration of two rectangular electronic elements stacked in a manner consistent with the teachings of the present invention.
Figure 10:
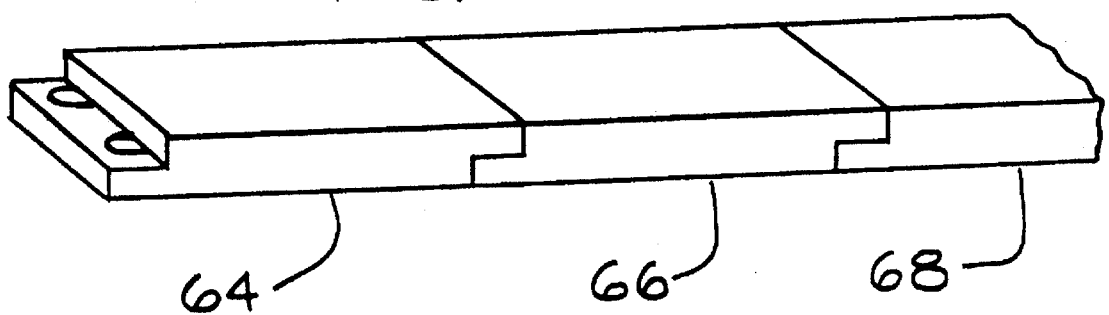
FIG. 10 is a schematic illustration of adjoining rectangular electronic elements as utilized in conjunction with the present invention.

FIG. 9 illustrates another embodiment of the electronic element used in conjunction with the ultrasonically weldable electronic circuit of the present invention. Electronic element 57 is generally rectangular in shape. However, an upward facing contact surface 56 protrudes from one end of the generally rectangular element 57. A corresponding downward facing contact surface 59 protrudes from the opposite end of element 57. Upward facing contact surface 56 comprises a thickness from the bottom plane of element 57 to a plane half way to the top surface of element 57. Correspondingly, downward facing contact surface 59 comprises a thickness from the top plane of element 57 to a plane half way to the bottom surface of element 57. Contact surface 56 contains terminal elements 20 which face upward. Contact surface 59 contains terminal elements 20 which face downward. Thus, when two similarly shaped elements are connected in an interlocking manner, extended electronic elements can be created. In FIG. 10, an interlocking combination of three electronic elements 64, 66 and 68 is shown. Although not illustrated, the bottom surface of each of electronic elements 64, 66 and 68 contains positioning protrusions, as well as terminal units to ensure properly aligned welding to a circuit board.

A major benefit of implementing the interlocking formation of elements as shown in FIG. 10 is achieved in applications requiring a large number of elements to be connected to the board. Instead of being detrimental to the durability of the electronic circuit (as in the prior art), a large number of electronic elements can actually be used to enhance rigidity. For instance, if an interlocking combination of elements completely covered a particular board, the combined thickness of the elements and the board would achieve the same effect as if the thickness of the board itself was increased. This benefit could not be achieved by prior art soldering techniques since, unlike ultrasonic welding, the peeling apart of the elements from the board could not be assured.

The interlocking structure of FIG. 10 could be achieved by ultrasonically welding the elements to each other either prior to, or simultaneously with, the welding of the elements to the circuit board. Moreover, it is contemplated by the inventor that other interlocking edge shapes could be used. Additionally, the last element in a series of elements could eliminate the contact surface since nothing will be connected to it.

Figure 11:
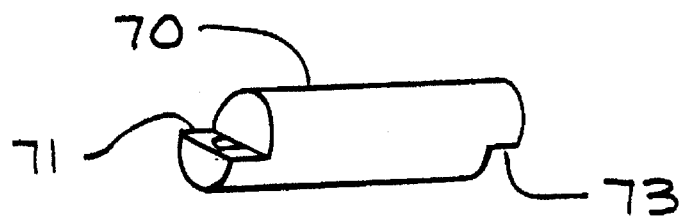
FIG. 11 is a schematic illustration of adjoining tubular elements as utilized in conjunction with the present invention.

FIG. 11 is another illustrative embodiment of the present invention wherein an electronic element 70 is shaped as a round (or tubular) post. Again, although not illustrated in the diagram, terminal units and positioning protrusions (or other alignment means) are set on a bottom portion of the outer circumference of electronic element 70 for attachment to a circuit board. Upward facing contact surface 71 and downward facing contact surface 73 permit the adjoining of tubular elements similar to the adjoining of rectangular elements in FIG. 10. Combinations of elements such as in FIG. 10, or combinations of tubular elements 70 of FIG. 11, permit electronic element assemblies which can extend beyond the board to which they are attached thereby allowing the combination of two or more distinct boards.

While specific embodiments of this invention have been shown and described, further modifications and improvements will occur to those skilled in the art. For example, other shapes of electronic elements can be connected in the same manner as illustrated above. I desire it to be understood, therefore, that this invention is not limited to the particular forms shown, and I intend to cover all modifications which do not depart from the spirit and scope of the invention.

What is claimed is:

1. An ultrasonically welded electronic circuit comprising:

a circuit board formed of ultrasonically weldable material;

a conductive circuit pattern formed on the circuit board; and at least one electronic element comprising
an ultrasonically weldable exterior region,
at least one terminal unit on a contact surface of the element for electrically coupling the element to a conductive circuit pattern of a circuit board, and
alignment means for aligning the electronic element to the circuit board so as to ensure correct positioning of the electronic element and reliable electrical coupling,
wherein the ultrasonically weldable exterior region is ultrasonically welded to the circuit board.

2. The ultrasonically welded electronic circuit according to claim 1, wherein the alignment means comprises at least one small protuberance, the small protuberance being provided on the at least one terminal unit for ensuring an electrically reliable connection between the electronic element and the conductive circuit pattern.

3. An ultrasonically welded electronic circuit according to claim 1, wherein the alignment means of the electronic element comprises a raised section of material surrounding the at least one terminal unit received by a corresponding indented surface on the circuit board.

4. An ultrasonically welded electronic circuit according to claim 1, wherein the alignment means comprises a plurality of posts on the electronic element received by a corresponding plurality of hollowed regions on the circuit board.

5. An ultrasonically welded electronic circuit according to claim 1 wherein the circuit board is formed of a thermoplastic resin.

6. An ultrasonically welded electronic circuit comprising:
   a circuit board formed of ultrasonically weldable material;
   a conductive circuit pattern formed on the circuit board; and
   at least one electronic element comprising an ultrasonically weldable exterior region, at least one terminal unit on a contact surface of the element for electrically coupling the element to another electronic element, and alignment means for aligning the electronic element to said another electronic element so as to ensure correct positioning of the electronic element and reliable electrical coupling, wherein the ultrasonically weldable exterior region is ultrasonically welded to the circuit board.

7. The ultrasonically welded electronic circuit according to claim 6, wherein the alignment means comprises at least one small protuberance, the small protuberance being provided on the at least one terminal unit for ensuring an electrically reliable connection between the electronic element and the conductive circuit pattern.

8. An ultrasonically welded electronic circuit according to claim 6, wherein the alignment means of the electronic element comprises a raised section of material surrounding the at least one terminal unit received by a corresponding indented surface on the circuit board.

9. An ultrasonically welded electronic circuit according to claim 6, wherein the alignment means comprises a plurality of posts on the electronic element received by a corresponding plurality of hollowed regions on the circuit board.

10. An ultrasonically welded electronic circuit according to claim 6 wherein the circuit board is formed of a thermoplastic resin.

* * * * *